(12) United States Patent
Zhang et al.

(10) Patent No.: US 12,707,861 B2
(45) Date of Patent: Aug. 11, 2026

(54) SPLICED SCREEN INCLUDING BOTTOM DISPLAY AND NON-DISPLAY REGIONS

(71) Applicants: Chengdu BOE Optoelectronics Technology Co., Ltd., Chengdu (CN); BOE TECHNOLOGY GROUP CO., LTD., Beijing (CN)

(72) Inventors: Shengxing Zhang, Beijing (CN); Liqiang Chen, Beijing (CN); Chuandong Liao, Beijing (CN); Jiafan Shi, Beijing (CN); Chao Yang, Beijing (CN); Wenliang Liu, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 479 days.

(21) Appl. No.: 18/028,525

(22) PCT Filed: Jun. 23, 2022

(86) PCT No.: PCT/CN2022/100689
§ 371 (c)(1),
(2) Date: Mar. 25, 2023

(87) PCT Pub. No.: WO2023/245541
PCT Pub. Date: Dec. 28, 2023

(65) Prior Publication Data

US 2024/0357902 A1 Oct. 24, 2024

(51) Int. Cl.
*H10K 59/80* (2023.01)
*H10K 59/95* (2023.01)
(Continued)

(52) U.S. Cl.
CPC ........... *H10K 59/873* (2023.02); *H10K 59/95* (2023.02); *H10K 59/18* (2023.02); *H10K 2102/311* (2023.02)

(58) Field of Classification Search
CPC ...... H10K 59/873; H10K 59/95; H10K 59/18; G09F 9/30; G09F 9/33; G02F 1/1333
See application file for complete search history.

(56) References Cited

U.S. PATENT DOCUMENTS 10,950,685 B2 * 3/2021 Chen ...................... H10K 59/18
2018/0190631 A1 * 7/2018 Kim .................... G02F 1/13336
(Continued)

FOREIGN PATENT DOCUMENTS

CN 105044959 A 11/2015
CN 105044964 A * 11/2015 ........... G02F 1/1335
(Continued)

*Primary Examiner* — Ida M Soward
(74) *Attorney, Agent, or Firm* — HOUTTEMAN LAW LLC

(57) ABSTRACT

A spliced screen includes: first display panels spliced together, each of which includes a first display region and a first non-display region around the first display region; the first non-display region is a light-transmitting region; and second display panels on non-display sides of the first display panels, each of the second display panels includes a second display region and a second non-display region around the second display region, and light outgoing directions of first and second display panels are the same. A spacing region is arranged between the first display regions of any two adjacent first display panels, and the spacing region includes at least part of the first non-display regions of the two adjacent first display panels; the second display region and the spacing region overlap each other in a thickness direction of the spliced screen.

20 Claims, 3 Drawing Sheets

(51) Int. Cl.

| | |
|---|---|
| *H10K 59/18* | (2023.01) |
| *H10K 102/00* | (2023.01) |

(56) References Cited

U.S. PATENT DOCUMENTS

| | | | | |
|---|---|---|---|---|
| 2019/0131381 | A1* | 5/2019 | Tang | H10K 59/18 |
| 2020/0285271 | A1* | 9/2020 | Huang | G02F 1/13336 |
| 2020/0337160 | A1* | 10/2020 | Hsiao | G09F 9/3026 |
| 2022/0404659 | A1* | 12/2022 | Qi | G02F 1/133528 |
| 2022/0415217 | A1* | 12/2022 | Zhang | G09G 3/20 |
| 2024/0027813 | A1* | 1/2024 | Sun | G02F 1/13336 |
| 2024/0036374 | A1* | 2/2024 | Xiao | G02F 1/133388 |
| 2024/0038103 | A1* | 2/2024 | Fan | G09F 9/35 |
| 2025/0004314 | A1* | 1/2025 | Chen | G02F 1/1333 |

FOREIGN PATENT DOCUMENTS

| | | | | | |
|---|---|---|---|---|---|
| CN | 108847137 | A | | 11/2018 | |
| CN | 110379314 | A | | 10/2019 | |
| CN | 111524452 | A | | 8/2020 | |
| CN | 111599269 | A | | 8/2020 | |
| CN | 111653207 | A | | 9/2020 | |
| CN | 211654163 | U | * | 10/2020 | G09F 9/30 |
| CN | 113270049 | A | * | 8/2021 | G09F 9/33 |
| CN | 113539093 | A | | 10/2021 | |
| CN | 214669956 | U | * | 11/2021 | G09F 9/35 |
| CN | 113921539 | A | | 1/2022 | |
| CN | 114355657 | A | | 4/2022 | |
| WO | WO-2021007998 | A1 | * | 1/2021 | H10W 90/00 |

* cited by examiner

SPLICED SCREEN INCLUDING BOTTOM DISPLAY AND NON-DISPLAY REGIONS

TECHNICAL FIELD

The present disclosure relates to the field of display technology, and in particular to a spliced screen and a display apparatus.

BACKGROUND

With the rapid development of display technology, a multi-screen spliced image display (the image display by a plurality of screens spliced together) is more and more widely used in large-scale places such as markets, cinemas, stadiums and the like, so that the technical problems of high cost and difficult maintenance of a single large screen are solved, and the multi-screen spliced image display has high expandability and can be suitable for displaying images of various sizes.

SUMMARY

The embodiment of the present disclosure provides a spliced screen and a display apparatus.

In a first aspect, an embodiment of the present disclosure provides a spliced screen, including: a plurality of first display panels spliced together, wherein each first display panel includes a first display region and a first non-display region around the first display region; the first non-display region is a light-transmitting region; and a plurality of second display panels on non-display sides of the plurality of first display panels, wherein each second display panel includes a second display region and a second non-display region around the second display region, and light outgoing directions of each second display panel and each first display panel are the same; and wherein a spacing region is arranged between the first display regions of any two adjacent first display panels, and the spacing region includes at least part of the first non-display regions of the two adjacent first display panels; the second display region and the spacing region overlap each other in a thickness direction of the spliced screen.

In some embodiments, an orthographic projection of the spacing region on the second display panel is within the second display region.

In some embodiments, the first display panel is a flexible display panel, the spliced screen further includes: a plurality of first support layers, and each first display panel is on the corresponding first support layer; and each second display panel is between two first support layers corresponding to two first display panels adjacent to the second display panel.

In some embodiments, the spliced screen further includes a first back film, a first optical adhesive layer and a first buffer layer between each first display panel and the corresponding first support layer; wherein the first optical adhesive layer is on a side of the first back film away from the first display panel; and the first buffer layer is on a side of the first optical adhesive layer away from the first back film.

In some embodiments, the first buffer layer includes a first buffer pad and a second buffer pad surrounding the first buffer pad; an orthographic projection of the first buffer pad on the first back film is within an orthographic projection of the first support layer on the first back film; an area of the first buffer layer is not smaller than an area of the first display panel, and a difference therebetween is smaller than 1/10 of an area of the first non-display region; and the second buffer pad has an elastic modulus less than that of the first buffer pad.

In some embodiments, the area of the first buffer layer is equal to the area of the first display panel.

In some embodiments, for each second display panel and one first display panel adjacent to the second display panel, there is a first distance between a boundary of the first display region and a boundary of the first support layer, there is a second distance between a boundary of the second display region and the boundary of the first support layer, and the first distance is greater than the second distance.

In some embodiments, each second display panel is a flexible display panel, the spliced screen further includes: a plurality of second support layers, wherein each second display panel is on the corresponding second support layer.

In some embodiments, a thickness of each second display panel and a thickness of each second support layer are less than a thickness of each first support layer.

In some embodiments, each second display panel and the corresponding second support layer are adhered to the corresponding first support layer by an adhesive layer.

In some embodiments, a material of the adhesive layer at least comprises fluoridized glue.

In some embodiments, the spliced screen further includes a second back film, a second optical adhesive layer, and a second buffer layer between each second display panel and the corresponding second support layer; wherein the second back film, the second optical adhesive layer and the second buffer layer are sequentially arranged along a direction away from the second display panel.

In some embodiments, each first display panel includes a first display substrate, a first polarizer and a first cover plate, and the first polarizer is on the display side of the first display substrate; the first cover plate is on a side of the first polarizer away from the first display substrate.

In a second aspect, an embodiment of the present disclosure provides a display apparatus, which includes the spliced screen described in the first aspect.

BRIEF DESCRIPTION OF DRAWINGS

The accompanying drawings, which are provided for further understanding of embodiments of the present disclosure and constitute a part of this specification, are for explaining the present disclosure together with the embodiments of the present disclosure, but are not intended to limit the present disclosure. In the drawings.

DETAIL DESCRIPTION OF EMBODIMENTS

Figure 1:
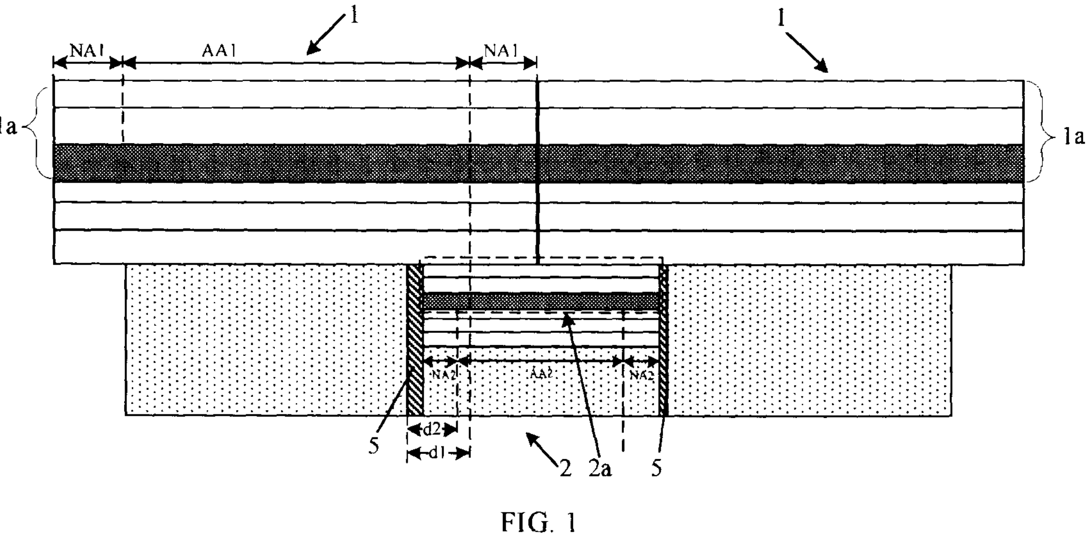
FIG. 1 is a schematic diagram of a structure of a spliced screen according to an embodiment of the present disclosure.

The detailed description of the present disclosure will be described in further detail below with reference to the accompanying drawings. It should be understood that the detailed description described here is only used to illustrate and explain, not to limit, the present disclosure.

In order to make the objects, technical solutions and advantages of the embodiments of the present disclosure more apparent, the technical solutions of the embodiments of the present disclosure will be clearly and completely described below with reference to the drawings of the embodiments of the present disclosure. It is to be understood that the described embodiments are only a few, not all, embodiments of the present disclosure. All other embodiments, which can be derived by a person skilled in the art from the described embodiments of the present disclosure without inventive step, are within the scope of protection of the present disclosure.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

With the rapid development of display technology, a large-scale display apparatus formed by splicing a plurality of display panels together is increasingly applied. Such an apparatus solves the technical problems of high cost and difficult maintenance of a single large screen, and has high expandability and can be suitable for displaying images of various sizes. In the related art, a spliced screen is mostly formed by splicing a plurality of light emitting diode (LED) devices together, but since an LED display panel itself is made of a rigid material, a frame is inevitably included. Thus, an obvious seam exists between two LED display panels spliced together.

An organic light emitting diode (OLED) device is an electroluminescent device based on an organic semiconductor material, and has high light conversion efficiency and low power consumption, and an OLED display panel has flexible characteristics and can be formed into a display panel in various forms such as curved, folding, an irregular shape, curling or the like. Based on the flexible characteristics of the OLED display panel, the OLED display panel is more suitable for an oversized spliced screen compared with an LED display panel.

In a spliced screen composed of a plurality of OLED display panels, the splicing seam is obviously eliminated compared with a spliced screen composed of a plurality of LED display panels, but the display effect of the spliced screen is still affected.

In order to solve at least one of the above technical problems, an embodiment of the present disclosure provides a spliced screen.

FIG. 1 is a schematic diagram of a structure of a spliced screen according to an embodiment of the present disclosure. As shown in FIG. 1, the spliced screen includes a plurality of first display modules 1 and a plurality of second display modules 2, where each first display module 1 includes a first display panel 1*a*, and each second display module 2 includes a second display panel 2*a*.

The plurality of first display panels 1*a* are spliced together, each first display panel 1*a* includes a first display region AA1 and a first non-display region NA1 around the first display region AA1, and the first non-display region NA1 is a light-transmitting region. The second display panel 2*a* is located on a non-display side of the first display panel 1*a*, the second display panel 2*a* includes a second display region AA2 and a second non-display region NA2 around the second display region AA2, and a light outgoing direction of the second display panel 2*a* is the same as that of the first display panel 1*a*.

A spacing region is arranged between the first display regions AA1 of any two adjacent first display panels 1*a*, and includes at least part of the first non-display regions NA1 of the two adjacent first display panels 1*a*; the second display region AA2 overlaps the spacing region in a thickness direction of the spliced screen. The second display region AA2 overlaps the spacing region in the thickness direction of the spliced screen, which means that by taking a plane where the spliced screen is located as a reference plane, an orthographic projection of the second display region AA2 on the reference plane overlaps an orthographic projection of the spacing region on the reference plane.

It should be noted that the non-display side is a side opposite to the light outgoing direction of the display panel, i.e., a side of the display panel away from the light outgoing direction.

In the spliced screen provided by the embodiment of the present disclosure, the spacing region includes at least part of the first non-display regions NA1 of any two adjacent first display panels 1*a*, the spacing region is equivalent to a splicing seam between the two adjacent first display regions. Because the first non-display region NA1 is a transparent region, the spacing region is also a transparent region. The second display panel 2*a* is located on the non-display side of the first display panel 1*a*, and has the light outgoing direction which is the same as the light outgoing direction of the first display panel 1*a*. In addition, the second display region AA2 of the second display panel 2*a* overlaps the spacing region on the thickness direction of the spliced screen, that is to say, at least a part of the light emitted from the second display panel 2*a* can pass through the transparent spacing region, so that the splicing seam between the two adjacent first display regions can display pictures, and thus, the poor display caused by the existence of the spacing region can be compensated, thereby improving the display effect of the spliced screen.

In some embodiments, as shown in FIG. 1, an orthographic projection of the spacing region on the second display panel 2*a* is located in the second display region AA2, so that the whole spacing region may display the picture content of the second display region AA2, display defects caused by picture missing in the spacing region are avoided, and the display effect of the spliced screen is improved.

Figure 2:
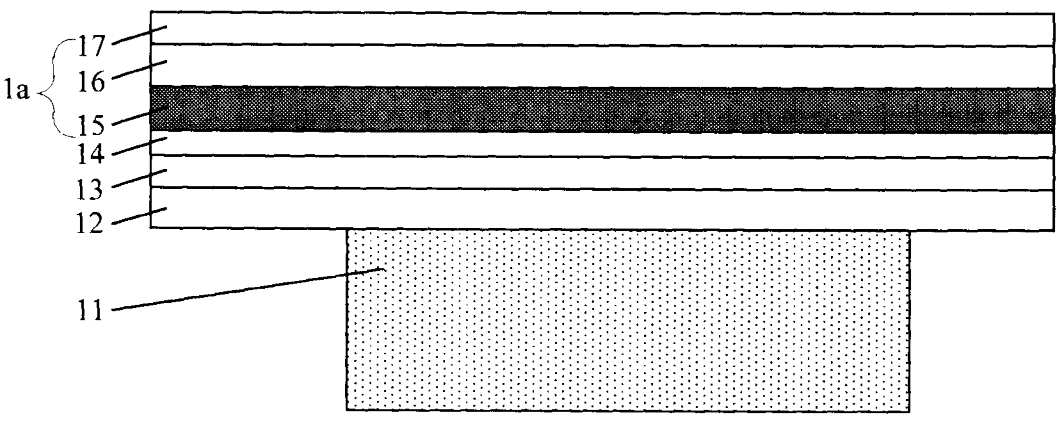
FIG. 2 is a schematic diagram of a structure of a first display module according to an embodiment of the present disclosure.

FIG. 2 is a schematic diagram of a structure of a first display module according to an embodiment of the present disclosure. In some embodiments, as shown in FIGS. 1 and 2, the first display panel 1*a* is a flexible display panel, and each first display module 1 further includes: a first support layer 11; the first display panel 1*a* is disposed on the first support layer 11, so that the first display panel 1*a* having flexible characteristics has a support structure with a relatively high hardness, and thus, the arrangement and installation of the first display panel 1*a* are facilitated, and the structural stability of the first display panel 1*a* is improved. The second display panel 2*a* is located between two first support layers 11 corresponding to two adjacent first display panels 1*a*.

It should be noted that a size of the first support layer 11 in a horizontal direction of the first display panel 1*a* is smaller than that of other layer in the first display module 1 in the horizontal direction of the first display panel 1*a*, so that a sufficient space can be reserved between the first support layers 11 of two adjacent first display modules 1 to provide the second display module 2.

In some embodiments, as shown in FIGS. 1 and 2, the first display panel 1*a* includes a first display substrate 15, a first polarizer 16 and a first cover plate 17, wherein the first polarizer 16 is located on the display side of the first display substrate 15; the first cover plate 17 is located on a side of the first polarizer 16 away from the first display substrate 15.

It should be noted that since the first display panel 1*a* is a flexible display panel, a substrate of the first display substrate 15 may be a flexible substrate, for example, made of a polyimide film.

The first polarizer 16 may be a circular polarizer, and specifically includes a linear polarizing film and a quarter-wave plate, the linear polarizing film is located between the quarter-wave plate and the first cover plate 17, and an angle between an optical axis direction of the quarter-wave plate and a polarizing direction of the linear polarizing film is 45 degrees. When the display panel receives external light, the external light, after passing through the linear polarizing film, is changed into linearly polarized light, which in turn is changed into circularly polarized light after passing through the quarter-wave plate, the circularly polarized light is reflected on a surface of the display panel, a rotation direction of the reflected circularly polarized light is reversed, and the circularly polarized light, after passing through the quarter-wave plate, is then changed into linearly polarized light with a polarizing direction perpendicular to a light-transmitting direction of the linear polarizing film, and is absorbed by the linear polarizing film. By means of the anti-reflection characteristics of the circular polarizer, the surface reflection for external light can be greatly reduced, so that the display effect of the display panel in an outdoor strong light environment can be effectively improved, and the use experience of a user is greatly improved.

The first cover plate 17 can improve light transmittance or the like, and can improve package effect of the first display panel 1*a*, and effectively prevent oxygen, aqueous vapor and the like from entering into the first display panel 1*a*.

Figure 3:
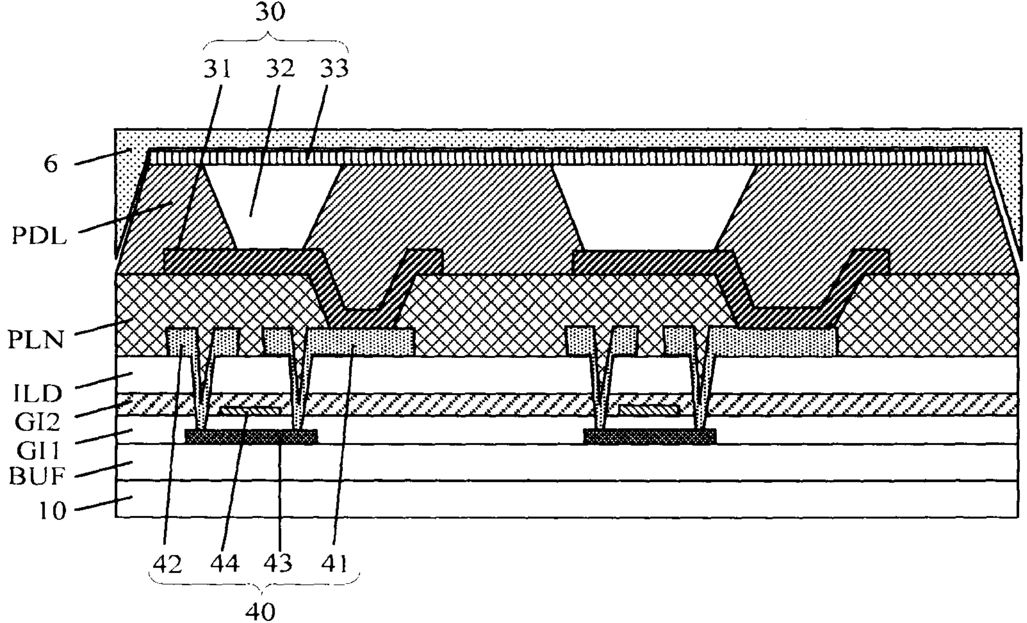
FIG. 3 is a schematic diagram of a structure of a first display substrate according to an embodiment of the present disclosure.

FIG. 3 is a schematic diagram of a structure of a first display substrate according to an embodiment of the present disclosure. In an example, as shown in FIG. 3, the first display substrate 15 may include a substrate, and thin film transistors 40, a planarization layer PLN, and light emitting devices 30 disposed on the substrate 10. A plurality of gate lines and a plurality of data lines are further disposed on the substrate, the plurality of gate lines and the plurality of data lines intersect to define a plurality of pixels, and a thin film transistor 40 and a light emitting device 30 are disposed in each pixel. The planarization layer PLN is located on a side of the thin film transistors 40 away from the substrate 10; each light emitting device 30 includes a first electrode 31 and a second electrode 33 opposite to each other and a light emitting functional layer 32 therebetween, wherein the first electrode 31 is connected to a drain electrode 41 of the thin film transistor 40 through a via in the planarization layer PLN.

As shown in FIG. 3, the display substrate further includes a pixel defining layer PDL located on a side of the first electrode 31 away from the substrate 10 and having a plurality of openings in which the light emitting devices 30 are disposed in one-to-one correspondence. The light emitting devices 30 are disposed in the openings in a one-to-one correspondence, which means that a portion of the first electrode 31 is exposed by the corresponding opening, the light emitting functional layer 32 is disposed in the corresponding opening, and the second electrodes 33 of the plurality of light emitting devices 30 may have a one-piece structure.

In addition, in the embodiment of the present disclosure, the light emitting device 30 is a top emission type light emitting device, and optionally, the first electrode 31 is a reflective electrode made of a metal material, and the second electrode 33 is a transparent electrode made of a transparent conductive material (for example, indium tin oxide). In one example, the first electrode 31 may be an anode and the second electrode 33 may be a cathode. In addition, the light emitting functional layer 32 may include a hole injection layer, a hole transport layer, a light emitting layer, an electron transport layer, and an electron injection layer stacked sequentially.

The thin film transistor 40 includes a gate electrode 44, an active layer 43, a source electrode 42 and a drain electrode 41. The thin film transistor 40 is a top gate type thin film transistor 40, as an example, the gate electrode 44 is located on a side of the active layer 43 away from the substrate 10, and the source electrode 42 and the drain electrode 41 are located on a side of the gate electrode 44 away from the substrate 10. A material of the active layer 43 may include, for example, an inorganic semiconductor material (e.g., polysilicon, amorphous silicon, etc.), an organic semiconductor material, an oxide semiconductor material. The active layer 43 includes a channel portion and a source connection portion and a drain connection portion on both sides of the channel portion, the source connection portion is connected to the source electrode 42 of the thin film transistor, and the drain connection portion is connected to the drain electrode 41 of the thin film transistor. Each of the source connection portion and the drain connection portion may be doped with an impurity (e.g., an N-type impurity or a P-type impurity) having a higher impurity concentration than the channel portion. The channel portion directly faces the gate electrode 44 of the thin film transistor, and when a voltage signal applied to the gate electrode 44 reaches a predetermined value, a carrier path is formed in the channel portion, so that the source electrode 42 and the drain electrode 41 of the thin film transistor are electrically connected to each other (the thin film transistor is turned on).

As shown in FIG. 3, the first display substrate 15 further includes: a buffer layer BUF, a first gate insulating layer GI1, a second gate insulating layer GI2, and an interlayer insulating layer ILD. The buffer layer BUF is located between the substrate 10 and the thin film transistor 40 and configured to prevent or reduce diffusion of metal atoms and/or impurities from the substrate 10 into the active layer 43 of the thin film transistor. The buffer layer BUF may include an inorganic material such as silicon oxide, silicon nitride, and/or silicon oxynitride, and may be formed as a multilayer or a single layer.

The first gate insulating layer GI1 is located between the active layer 43 and the gate electrode 44 of the thin film transistor; the second gate insulating layer GI2 and the interlayer insulating layer ILD are located between the gate electrode 44 and the source electrode 42 of the thin film transistor, and the interlayer insulating layer ILD is located on a side of the second gate insulating layer GI2 away from the substrate 10. The materials of the first gate insulating layer GI1, the second gate insulating layer GI2, and the interlayer insulating layer ILD may all include a silicon compound or a metal oxide, and may all be formed as a single layer or a multilayer, which is not limited in the embodiments of the present disclosure.

A gate electrode layer is provided on a side of the first gate insulating layer GI1 away from the substrate 10. The gate electrode layer includes a gate electrode 44 of each thin film transistor, a first electrode plate of a capacitor, and a second electrode plate of a capacitor. The second electrode plate (not shown) of the capacitor is disposed on a side of the second gate insulating layer GI2 away from the substrate 10, and is connected to the source electrode 42 of the thin film transistor, and a material of the second electrode plate may be the same as a material of the first electrode plate. A material of the gate electrode layer may include, for example, a metal, a metal alloy, a metal nitride, a conductive metal oxide, a transparent conductive material, or the like. For example, the gate electrode layer may include gold, an alloy of gold, silver, an alloy of silver, aluminum, an alloy of aluminum, aluminum nitride, nitride, tungsten nitride, copper, an alloy of copper, nickel, chromium, chromium nitride, molybdenum, an alloy of molybdenum, nitride, titanium nitride, platinum, tantalum, tantalum nitride, neodymium, scandium, strontium ruthenium oxide, zinc oxide, tin oxide, indium oxide, gallium oxide, indium tin oxide, indium zinc oxide, or the like. The gate electrode layer may include a single layer or a plurality of layers.

In addition, as shown in FIG. 3, the first display substrate 15 may further include an encapsulation layer 6 located on a side of the second electrode 33 away from the substrate 10, so as to isolate aqueous vapor, prevent each layer in the first display substrate from being corroded, and improve a protection effect on each layer. The encapsulation layer 6 may include an inorganic encapsulation layer and an organic encapsulation layer. For example, the encapsulation layer 6 includes a first inorganic encapsulation layer and a second inorganic encapsulation layer and an organic encapsulation layer therebetween.

In the first display substrate 15, a passivation layer (not shown) may be disposed between the drain electrode 41 of the thin film transistor 40 and the planarization layer PLN, and the first electrode 31 may be connected to the drain electrode 41 through a via penetrating through the passivation layer and the planarization layer PLN. A material of the passivation layer may include, for example, silicon oxynitride, silicon oxide, silicon nitride, or the like.

In some embodiments, as shown in FIGS. 1 and 2, a first back film 14, a first optical adhesive layer 13 and a first buffer layer 12 are further disposed between the first display panel 1*a* and the first support layer 11; the first optical adhesive layer 13 is located on a side of the first back film 14 away from the first display panel 1*a*; the first buffer layer 12 is located on a side of the first optical adhesive layer 13 away from the first back film 14.

The first optical adhesive layer 13 may include the OCA (optical clear adhesive), which has strong viscosity and can realize the attaching between any two adjacent layers on the display panel; and the OCA can absorb the ultraviolet light, can avoid the ultraviolet aging of the first optical adhesive layer 13 and the loss of the mechanical property and the optical property of the first optical adhesive layer 13; the OCA also has better optical performance, and can prevent the display effect of the display panel from being affected.

Figure 4:
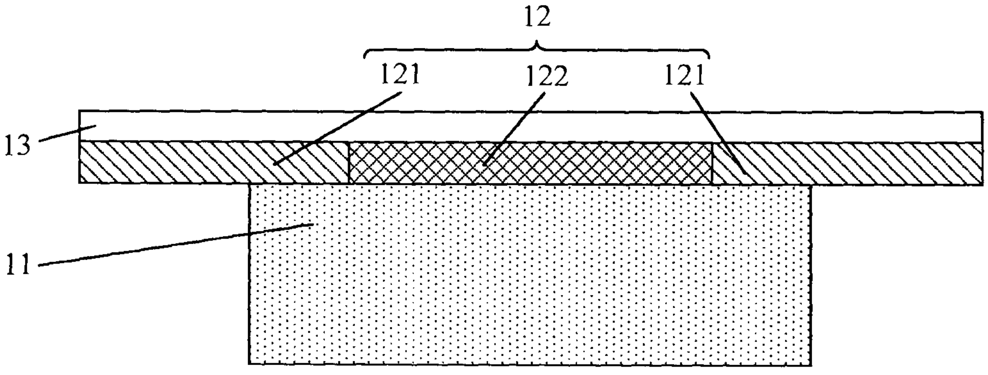
FIG. 4 is a schematic diagram of a part of a structure of a first display module according to an embodiment of the present disclosure.

FIG. 4 is a schematic diagram of a part of a structure of a first display module according to an embodiment of the present disclosure. In some embodiments, as shown in FIG. 4, the first buffer layer 12 includes a first buffer pad 121 and a second buffer pad 122 surrounding the first buffer pad 121; an orthographic projection of the first buffer pad 121 on the first back film 14 is positioned in an orthographic projection of the first support layer 11 on the first back film 14; an area of the first buffer layer 12 is not smaller than that of the first display panel 1*a*.

In one example, the area of the first buffer layer 12 is larger than the area of the first display panel 1*a*, and the difference therebetween is smaller than 1/10 of an area of the first non-display region; in another example, the area of the first buffer layer 12 is equal to the area of the first display panel 1*a*, that is, an orthographic projection of the first buffer layer 12 on a plane where the first back film 14 is located overlaps an orthographic projection of the first display panel 1*a* on the plane where the first back film 14 is located, so that when two first display panels 1*a* are spliced, the first buffer layers 12 on two adjacent first display panels 1*a*, especially, the second buffer pads 122 located in the edge regions, can buffer the stress applied when splicing the two first display panels 1*a*.

Meanwhile, an elastic modulus of the second buffer pad 122 is smaller than that of the first buffer pad 121, that is, the second buffer pad 122 is more flexible than the first buffer pad 121, thereby further avoiding damage to the first display panel 1*a* in the splicing process.

It should be noted that the spacing region of the first display panel 1*a* is a transparent region, and the picture content of the second display panel 2*a* may be displayed through the spacing region, so that portions of the first back film 14, the first optical adhesive layer 13, and the first buffer layer 12 overlapping with the spacing region in the thickness direction of the spliced screen are all made of transparent materials.

In some embodiments, as shown in FIG. 1, the second display module 2 is located between the first support layers 11 of two adjacent first display modules 1. In this case, in order to ensure the stability for the plurality of display modules in the spliced screen, a thickness of each of the second display panel 2*a* and the second support layer 21 in the second display module 2 is smaller than that of the first support layer 11 in the first display module 1. Further, a whole thickness of the second display module 2 is less than or equal to the thickness of the first support layer 11, to prevent the second display module 2 from protruding from the first display module 1, which is convenient for the installation of the whole spliced screen.

In some embodiments, the second display panel 2*a* and the second support layer 21 are both adhered to the first support layer 11 by an adhesive layer 5. A material of the adhesive layer 5 may be any one of fluoridized glue, TUFFY, acrylate-based glue or silicon-based glue. The above material of the adhesive layer has waterproof characteristics, and the adhesive layer 5 made of the above material can stably connect the second display panel 2*a* and the second support layer 21, and can avoid corrosion of aqueous vapor and bad influence on the display effect of the spliced screen.

It should be noted that a second back film 24, a second optical adhesive layer 23, a second buffer layer 22 and a second support layer 21 in the second display module 2 can be adhered to the first support layer 11 through the adhesive layer 5.

In one example, the second display module 2 and each of the two adjacent first support layers 11 have the adhesive layer 5 therebetween, that is, the adhesive layers 5 are located on both sides of the second display module 2. In another example, the adhesive layer 5 includes a first adhesive layer located on a side of the second display module 2 and a second adhesive layer located on a side of the second support layer 21 away from the second display panel 2*a*, the second adhesive layer may also be adhered to a surface of the first support layer 21 away from the first display panel 1*a*, and the first adhesive layer and the second adhesive layer have a one-piece structure. That is to say, the adhesive layer may clad (cover) a portion of the second display module 2 except a surface on a side of the light outgoing direction, thereby improving the stability of the spliced screen.

Figure 5:
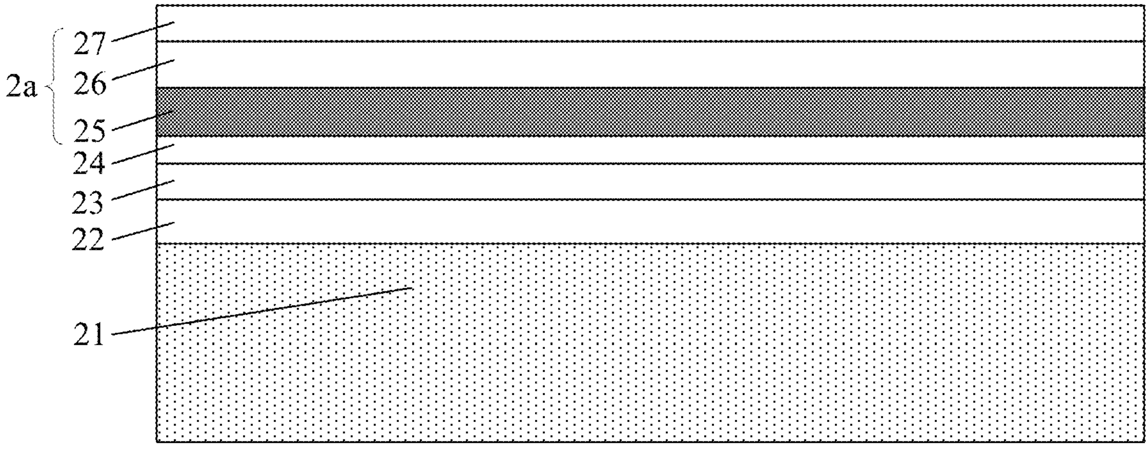
FIG. 5 is a schematic diagram of a structure of a second display module according to an embodiment of the present disclosure.

FIG. 5 is a schematic diagram of a structure of a second display module according to an embodiment of the present disclosure. In some embodiments, as shown in FIGS. 1 and 5, the second display panel 2*a* is a flexible display panel, and the second display module 2 further includes: a second support layer 21 on which the second display panel 2*a* is disposed, so that the second display panel 2*a* having flexible characteristics has a support structure with a relatively high hardness, facilitating arrangement and installation of the second display panel 2*a*.

In some embodiments, as shown in FIG. 5, a second back film 24, a second optical adhesive layer 23 and a second buffer layer 22 are further included between the second display panel 2*a* and the second support layer 21; the second back film 24, the second optical adhesive layer 23, and the second buffer layer 22 are sequentially disposed along a direction away from the second display panel 2*a*. Materials and functions of the second back film 24 and the second optical adhesive layer 23 in the second display module 2 are the same as those of the first back film 14 and the first optical adhesive layer 13 in the first display module 1, and are not described in detail herein.

It should be noted that, the first buffer layer 12 includes the first buffer pad 121 and the second buffer pad 122 made of two different materials, so as to buffer the stress applied when two adjacent first display panels 1*a* are spliced, and prevent the first display panels 1*a* from being damaged. However, the second display panel 2*a* is disposed between two adjacent first support layers 11 and is adhered to the two adjacent first support layers 11, and without considering damage due to collision, the second buffer layer 22 may be made of the same material as the first buffer pad 121; the second buffer layer 22 may be made of the same material as the second buffer pad 122; the second buffer layer 22 may be made of the same material as the first buffer layer 12 (that is, the first buffer pad 121 surrounds the second buffer pad 122), and the material of the second buffer layer 22 is not limited in the embodiment of the present disclosure.

As shown in FIG. 5, the second display panel 2*a* includes a second display substrate 25, a second polarizer 26 and a second cover plate 27, wherein the second polarizer 26 is located on the display side of the second display substrate 25; the second cover plate 27 is located on a side of the second polarizer 26 away from the first substrate. Moreover, the second display substrate 25, the second polarizer 26 and the second cover plate 27 in the second display panel 2*a* are the same as the first display substrate 15, the first polarizer 16 and the first cover plate 17 in the first display panel 1*a* in structure, material and function, which are not described in detail herein.

In some embodiments, as shown in FIG. 1, for the second display panel 2*a* and one first display panel 1*a* adjacent to the second display panel 2*a*; there is a first distance d1 between a boundary of the first display region AA1 and a boundary of the first support layer 11, there is a second distance d2 between a boundary of the second display region AA2 and the boundary of the first support layer 11, and the first distance d1 is greater than the second distance d2.

It should be noted that the second distance d2 is a distance between the boundary of the second display region AA2 and the boundary of the first support layer 11, and the second display panel 2*a* and the first support layer 11 are connected to each other by the adhesive layer 5, so that the second distance d2 includes not only a width of the second non-display region NA2 of the second display panel 2*a* but also a width of the adhesive layer. The width and the distance each refer to a dimension of the second display panel 2*a* in a direction toward the first support layer 11.

Figure 6:
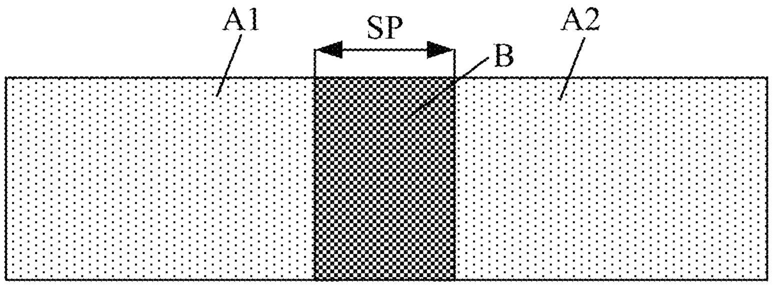
FIG. 6 is a schematic diagram of a display picture of a spliced screen according to an embodiment of the present disclosure.

FIG. 6 is a schematic diagram of a display picture of a spliced screen according to an embodiment of the present disclosure. As shown in FIG. 6, an A1 region and an A2 region are first display regions of two adjacent first display panels 1*a*, and a B region is a region where pictures are displayed by a portion of the second display region of the second display panel 2*a* exposed by the spacing region SP. Ideally, when the first distance d1 is equal to the second distance d2, the A1 region, the B region and the A2 region are sequentially connected together, and no gap exists in the display picture of the spliced screen. However, considering that the spliced screen has a certain assembly tolerance in the process of splicing and assembling the plurality of display modules, the first distance d1 is greater than the second distance d2, so that an orthographic projection of the spacing region SP on the second display panel 2*a* may be completely covered by the second display region, thereby avoiding the defect that a gap exists in the display picture due to the assembly tolerance, and improving the display effect of the spliced screen.

In addition, the picture content displayed by the part of the second display region, which overlaps the first display region in the thickness direction of the spliced screen, is consistent, so that the continuity of the picture displayed by the spliced screen is ensured.

The embodiment of the present disclosure further provides a display apparatus, which includes the above spliced screen and a driving structure for providing a driving signal to the spliced screen. The spliced screen includes a plurality of first display modules and a plurality of second display modules, wherein the first display modules include first display panels, and the second display modules include second display panels. The second display panel is located on the non-display side of the first display panel, and has the light outgoing direction which is the same as the light outgoing direction of the first display panel. In addition, the second display region of the second display panel overlaps the spacing region on the thickness direction of the spliced screen, that is to say, at least a part of the light emitted from the second display panel can pass through the transparent spacing region, so that the splicing seam between the two adjacent first display regions can display pictures, and thus, the poor display caused by the existence of the spacing region can be compensated, thereby improving the display effect of the display apparatus.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A spliced screen, comprising:

a plurality of first display panels spliced together, wherein each of the plurality of first display panels comprises a first display region and a first non-display region around the first display region; the first non-display region is a light-transmitting region; and a plurality of second display panels on non-display sides of the plurality of first display panels, wherein each of the plurality of second display panels comprises a second display region and a second non-display region around the second display region, and light outgoing directions of the plurality of second display panels and the plurality of first display panels are identical; and wherein a spacing region is arranged between the first display regions of any two adjacent first display panels, and the spacing region comprises at least part of the first non-display regions of the two adjacent first display panels; the second display region of a corresponding second display panel corresponding to the two adjacent first display panels and the spacing region overlap each other in a thickness direction of the spliced screen.

2. The spliced screen of claim 1, wherein an orthographic projection of the spacing region on the corresponding second display panel is within the second display region.

3. The spliced screen of claim 1, wherein each of the plurality of first display panels is a flexible display panel, the spliced screen further comprises a plurality of first support layers, and each of the plurality of first display panels is on a corresponding first support layer of the plurality of first support layers; and each of the plurality of second display panels is between two first support layers corresponding to two adjacent first display panels corresponding to the second display panel.

4. The spliced screen of claim 3, further comprising a first back film, a first optical adhesive layer and a first buffer layer between each of the plurality of first display panels and the corresponding first support layer;

wherein the first optical adhesive layer is on a side of the first back film away from the first display panel; and the first buffer layer is on a side of the first optical adhesive layer away from the first back film.

5. The spliced screen of claim 4, wherein the first buffer layer comprises a first buffer pad and a second buffer pad surrounding the first buffer pad;

an orthographic projection of the first buffer pad on the first back film is within an orthographic projection of the corresponding first support layer on the first back film;

an area of the first buffer layer is not smaller than an area of the first display panel, and a difference between the area of the first buffer layer and the area of the first display panel is smaller than 1/10 of an area of the first non-display region; and the second buffer pad has an elastic modulus less than that of the first buffer pad.

6. The spliced screen of claim 5, wherein the area of the first buffer layer is equal to the area of the first display panel.

7. The spliced screen of claim 3, wherein for each second display panel and one first display panel adjacent to the second display panel, there is a first distance between a boundary of the first display region and a boundary of the corresponding first support layer, there is a second distance between a boundary of the second display region and the boundary of the corresponding first support layer, and the first distance is greater than the second distance.

8. The spliced screen of claim 3, wherein each of the plurality of second display panels is a flexible display panel, and the spliced screen further comprises a plurality of second support layers, and each of the plurality of second display panels is on a corresponding second support layer of the plurality of second support layers.

9. The spliced screen of claim 8, wherein each of a thickness of each of the plurality of second display panels and a thickness of each of the plurality of second support layers is less than a thickness of each of the plurality of first support layers.

10. The spliced screen of claim 8, wherein both each of the plurality of second display panels and a corresponding second support layer are adhered to the corresponding first support layer by an adhesive layer.

11. The spliced screen of claim 10, wherein a material of the adhesive layer at least comprises fluoridized glue.

12. The spliced screen of claim 8, further comprising a second back film, a second optical adhesive layer, and a second buffer layer between each of the plurality of second display panels and the corresponding second support layer;

wherein the second back film, the second optical adhesive layer and the second buffer layer are sequentially arranged along a direction away from the second display panel.

13. The spliced screen of claim 1, wherein each of the plurality of first display panels comprises a first display substrate, a first polarizer and a first cover plate, and the first polarizer is on a display side of the first display substrate; and the first cover plate is on a side of the first polarizer away from the first display substrate.

14. A display apparatus, comprising the spliced screen of claim 1.

15. The spliced screen of claim 2, wherein each of the plurality of first display panels comprises a first display substrate, a first polarizer and a first cover plate, and the first polarizer is on a display side of the first display substrate; and the first cover plate is on a side of the first polarizer away from the first display substrate.

16. The spliced screen of claim 3, wherein each of the plurality of first display panels comprises a first display substrate, a first polarizer and a first cover plate, and the first polarizer is on a display side of the first display substrate; and the first cover plate is on a side of the first polarizer away from the first display substrate.

17. The spliced screen of claim 4, wherein each of the plurality of first display panels comprises a first display substrate, a first polarizer and a first cover plate, and the first polarizer is on a display side of the first display substrate; and the first cover plate is on a side of the first polarizer away from the first display substrate.

18. The spliced screen of claim 5, wherein each of the plurality of first display panels comprises a first display substrate, a first polarizer and a first cover plate, and the first polarizer is on a display side of the first display substrate; and the first cover plate is on a side of the first polarizer away from the first display substrate.

19. The spliced screen of claim 6, wherein each of the plurality of first display panels comprises a first display substrate, a first polarizer and a first cover plate, and the first polarizer is on a display side of the first display substrate; and the first cover plate is on a side of the first polarizer away from the first display substrate.

20. The spliced screen of claim 7, wherein each of the plurality of first display panels comprises a first display substrate, a first polarizer and a first cover plate, and the first polarizer is on a display side of the first display substrate; and the first cover plate is on a side of the first polarizer away from the first display substrate.

* * * * *